United States Patent
Takeuchi et al.

(10) Patent No.: US 7,923,904 B2
(45) Date of Patent: Apr. 12, 2011

(54) ELECTRONIC PACKAGE HAVING STRESS BUFFER LAYER ON MOUNTING SURFACE THEREOF, AND METHOD FOR MANUFACTURING SAME

(75) Inventors: Hitoshi Takeuchi, Chiba (JP); Keiji Sato, Chiba (JP); Kiyoshi Aratake, Chiba (JP); Masashi Numata, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 12/851,686

(22) Filed: Aug. 6, 2010

(65) Prior Publication Data
US 2010/0295421 A1    Nov. 25, 2010

Related U.S. Application Data

(63) Continuation of application No. PCT/JP2009/052184, filed on Feb. 9, 2009.

(30) Foreign Application Priority Data

Feb. 13, 2008  (JP) .................... 2008-032046

(51) Int. Cl.
*H01L 41/08* (2006.01)
(52) U.S. Cl. .......... 310/340; 310/344; 310/348
(58) Field of Classification Search .......... 310/340, 310/344, 348
See application file for complete search history.

(56) References Cited

U.S. PATENT DOCUMENTS

| | | | |
|---|---|---|---|
| 6,204,454 B1 * | 3/2001 | Gotoh et al. | 174/255 |
| 6,541,897 B2 * | 4/2003 | Endoh | 310/344 |
| 6,960,870 B2 * | 11/2005 | Kikushima et al. | 310/344 |
| 7,002,282 B2 * | 2/2006 | Mishima | 310/313 R |
| 7,675,224 B2 * | 3/2010 | Tanaya | 310/370 |
| 2007/0252482 A1 * | 11/2007 | Sakai | 310/348 |
| 2007/0278903 A1 * | 12/2007 | Yamamoto | 310/348 |
| 2009/0224634 A1 * | 9/2009 | Murakami et al. | 310/348 |

FOREIGN PATENT DOCUMENTS

| | | |
|---|---|---|
| JP | 07-154183 A | 6/1995 |
| JP | 07-212159 A | 8/1995 |
| JP | 2002-289735 A | 10/2002 |
| JP | 2007-129327 A | 5/2007 |

OTHER PUBLICATIONS

International Search Report for International Application No. PCT/JP2009/052184, dated Apr. 7, 2009, 2 pages.

* cited by examiner

*Primary Examiner* — J. SanMartin

(74) *Attorney, Agent, or Firm* — Brinks Hofer Gilson & Lione

(57) ABSTRACT

An electronic component capable of withstanding stress from a printed circuit board or the like is provided. In an electronic component, a cavity hermetically sealed by a base and a lid is formed. In the cavity, a crystal resonator is supported by a supporting member over the top surface of the base. The base is made of glass. A stress buffer layer made of a conductive resin or the like is formed over the whole bottom surface of the base. An external electrode and an external electrode that are in continuity with the electrodes of the crystal resonator individually extend to the bottom surface of the stress buffer layer via the side surfaces of the base and stress buffer layer. The thus configured electronic component is surface-mounted by, for example, soldering the external electrode and external electrode formed on the bottom surface of the stress buffer layer to a printed circuit board.

9 Claims, 8 Drawing Sheets

ELECTRONIC PACKAGE HAVING STRESS BUFFER LAYER ON MOUNTING SURFACE THEREOF, AND METHOD FOR MANUFACTURING SAME

RELATED APPLICATIONS

This application is a continuation of PCT/JP2009/052184 filed on Feb. 9, 2009, which claims priority to Japanese Application No. 2008-032046 filed on Feb. 13, 2008. The entire contents of these applications are incorporated herein by reference.

BACKGROUND OF THE INVENTION

1. Field of the Invention

The present invention relates to an electronic component, an electronic apparatus, and a base member manufacturing method, and for example, relates to an electronic component with a crystal resonator housed in a glass package.

2. Description of the Related Art

In recent years, surface mount devices with an electronic device such as a crystal resonator and semiconductor housed in a package are widely used.

Each surface mount device has external electrodes on the bottom surface, or the like, and is mounted by soldering the external electrodes onto the surface of a printed circuit board.

One example of the package is a ceramic base to which a metal or glass lid is bonded. This type of package is widely used.

However, the cost for the package made of ceramic is high. So, in recent years, a package with a base made of glass is proposed, as described in Patent Document 1 below.

This technique is to bond a glass case by anodic bonding, or the like, and house a piezo-resonator in its internal space.

However, glass has less strength than ceramic, and the surface mount devices are directly mounted on the printed circuit board. So, when the printed circuit board bends after mounting the surface mount devices, the surface mount devices may be subjected to stress and damaged (for example, the glass may become cracked).

In order to address this problem, a technique for reinforcing the glass by chemical processing is proposed, as described in Patent Document 2 below. This technique is to substitute potassium ion for sodium ion near the glass surface to apply stress caused by the difference in size of the ions to the glass surface, thereby strengthening the glass.

Patent Document 1: Japanese Patent No. 3,621,435
Patent Document 2: JP-A-07-212159

However, the chemical processing may indeed strengthen the glass, but it causes a problem of reducing the strength due to the history of the heat treatment. The reason of this problem may be that the potassium ion near the glass surface diffuses into or within the glass.

Also, other problems are that the glass case may become warped, that cutting may become difficult after wafer processing, and that a cutting surface is not strengthened after cutting the glass.

SUMMARY OF THE INVENTION

In view of the above, it is an object of the present invention to provide an electronic component, and the like, that can withstand stress from a printed circuit board, and the like, after being mounted.

In order to achieve the above object, the present invention provides an electronic component which comprises a base member, an electronic device disposed on one surface side of the base member, a stress buffer member formed on the other surface of the base member, and external electrodes disposed on the formed stress buffer member, and in continuity with the electrodes of the electronic device.

In accordance with an aspect of the present invention, the external electrodes are connected to a printed circuit board by surface mounting, and the stress buffer member is formed in a laminar shape between the base member and the external electrodes.

In accordance with another aspect of the present invention, the electronic component further comprises a lid disposed on the one surface of the base member and forming a cavity isolated from the outside air by the lid and the one surface. The cavity is formed using a concave portion provided on at least one surface of the base member, or the surface of the lid opposite to the one surface, and the electronic device is disposed in the cavity.

In accordance with another aspect of the present invention, the stress buffer member is made of an insulating material, and the external electrodes are in continuity with the electrodes of the electronic device via through-holes formed in the stress buffer member.

In accordance with another aspect of the present invention, the electronic component comprises a second buffer member formed on the surface of the stress buffer member, in which second through-holes are formed at locations different from those of the through-holes in the stress buffer member, and second external electrodes in continuity with the external electrodes via the second through-holes and disposed on the surface of the second buffer member.

In accordance with another aspect of the present invention, the stress buffer member is made of a conductive material, and the external electrodes are in continuity with the electrodes of the electronic device via the stress buffer member.

In accordance with another aspect of the present invention, the electronic component comprises conductive members passing through the base member, and providing the continuity between the electrodes of the electronic device and the external electrodes.

Another aspect of the present invention provides an electronic apparatus comprising the electronic component on a printed circuit board thereof. Such an electronic apparatus performs a desired function using an electric signal output from the electronic component.

The present invention provides a base member manufacturing method, which comprises a stress buffer member forming step for forming a stress buffer member on the other surface of the base member, while disposing an electronic device on one surface side of a base member, and an external electrode disposing step for disposing external electrodes in continuity with the electrodes of the electronic device on the formed stress buffer member.

In the base member manufacturing method according to the present invention, the stress buffer member is made of an insulating material. The method further comprises a through-hole forming step for forming through-holes in the formed stress buffer member. The external electrode disposing step provides the continuity between the electronic device and the external electrodes using the formed through-holes.

In accordance with the present invention, the stress buffer member disposed between external electrodes and a package allows an electronic component to withstand stress from a printed circuit board, or the like, after the electronic component is mounted.

DETAILED DESCRIPTION OF THE PREFERRED EMBODIMENTS

(1) Summary of Embodiments

Figure 1:
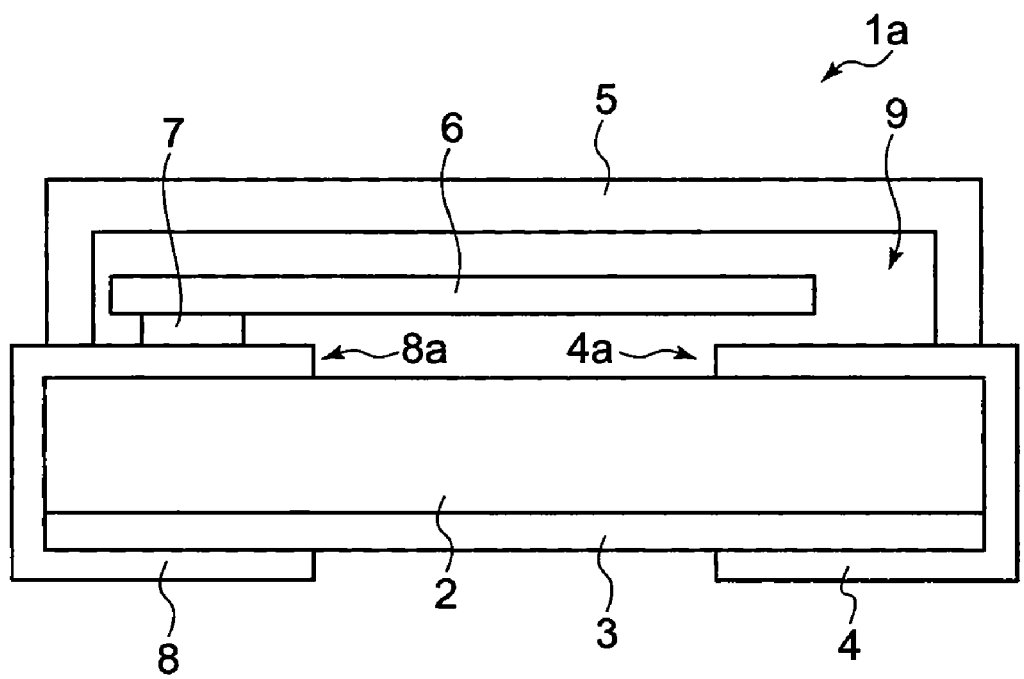
FIG. 1 is a diagram showing the cross-section of an electronic component in accordance with a first embodiment.

In accordance with embodiments of the present invention, a stress buffer layer is provided between external electrodes and glass, or the like, in a package made of glass, or the like.

In an electronic component 1a (FIG. 1), a cavity 9 hermetically sealed by a base 2 and a lid 5 is formed. In the cavity 9, a crystal resonator 6 is supported by a supporting member 7 over the top surface of the base 2.

The base 2 is made of glass. A stress buffer layer 3 made of a conductive resin, or the like, is formed over the whole bottom surface of the base 2.

An external electrode 8 and an external electrode 4 that are in continuity with the electrodes of the crystal resonator 6 individually extend to the bottom surface of the stress buffer layer 3 via the side surfaces of the base 2 and stress buffer layer 3.

The configured electronic component 1a is surface-mounted by, for example, soldering the external electrode 8 and external electrode 4 formed on the bottom surface of the stress buffer layer 3 to a printed circuit board.

Even if the electronic component 1a is subjected to stress due to the bending of the printed circuit board, or the like, the stress buffer layer 3 becomes deformed to absorb the stress, thereby reducing the stress on the base 2 to prevent the base 2 from being damaged.

(2) Details of Embodiments

First Embodiment

FIG. 1 is a diagram showing the cross-section of an electronic component 1a in accordance with an embodiment of the invention.

The electronic component 1a includes a base 2, a stress buffer layer 3, an external electrode 4, an external electrode 8, a crystal resonator 6, a supporting member 7, and a lid 5.

Note that, when being mounted, the bottom surface of the external electrode 4 (the side facing the stress buffer layer 3) is soldered to the printed circuit board, and FIG. 1 is the cross-sectional view of the electronic component 1a viewed in parallel to the surface of the printed circuit board.

So, in the following, the side of the electronic component 1a facing the printed circuit board is referred to as "bottom surface side" when being mounted, and the side opposite to the bottom surface side is referred to as "top surface side."

The crystal resonator 6 includes, for example, a tuning fork type crystal resonator, and the proximal end of the tuning fork is supported by the supporting member 7.

Electrodes (not shown) are provided on the tuning fork arm of the crystal resonator 6. Applying a predetermined pulse between these electrodes can cause the crystal resonator 6 to oscillate at a predetermined frequency.

The supporting member 7 supports the crystal resonator 6 to be cantilevered in a predetermined position with respect to the base 2, so that the tuning fork arm of the crystal resonator 6 can vibrate in a space within the cavity 9.

The base 2 is a plate-shape member made of glass, and the crystal resonator 6 supported by the supporting member 7 is mounted above the top surface thereof.

The material of the base 2 is soda glass, which is advantageously low-cost and capable of being bonded by anodic bonding with a thickness of, for example, 0.05 to 2 mm, and desirably, 0.1 to 0.5 mm.

In addition to soda glass, borosilicate glass, alkali-free glass, and crystallized glass, or the like, (strengthened if needed) can be used.

In this embodiment, the base 2 works as a base member, and the crystal resonator 6 works as an electronic device disposed on one surface side (the top surface side) of the base member (the base 2).

The stress buffer layer 3 is formed over the whole (or wide) area of the bottom surface of the electronic component 1a (the surface facing the printed circuit board in surface mounting).

The stress buffer layer 3 is made of an insulating resin and has a thickness of, for example, 5 to 100 µm.

As for the material of the stress buffer layer 3, for example, a single or composite material of polyimide, epoxy, polyamide-imide, silicon, acrylic, benzocyclobutene, poly(benzoxazole), or the like, having an elastic modulus smaller than thermoset glass or thermoplastic glass is used.

In this embodiment, the stress buffer layer 3 works as a stress buffer member formed on the other surface (the bottom surface) of the base member (the base 2). Also, the stress buffer layer 3 is formed in a laminar shape between the base member (the base 2) and the external electrodes (the external electrodes 4, 8).

The external electrodes 4, 8 are made of, for example, metal film and are electrically connected to internal wirings 4a, 8a disposed on the tuning fork arm of the crystal resonator 6.

Then, the external electrodes 4, 8 are pulled out of the cavity 9 through the bonded surface between the lid 5 and the base 2, and formed to extend from the side surfaces of the base 2 to the bottom surface of the stress buffer layer 3.

Then, the external electrodes 4, 8 to be connected to the wiring substrate (printed circuit board) by surface mounting are disposed on the stress buffer member (the stress buffer layer 3), and work as external electrodes in continuity with the electrodes of the electronic device (the crystal resonator 6).

Describing the external electrodes 4, 8 in more detail, the external electrodes 4, 8 include as substrate an adhesive layer of Cr, Ti or W (formed by, for example, sputtering), a sputtered layer including a single- or multi-layer of a single or composite material of Au, Cu, Ag, Al or Ni (each with a thickness of about 5 nm to 1 µm), and the like, include as intermediate layer a plating of Cu, Ni or Ni—P (with a thickness of 1 to 10 µm), and include a plating layer as surface layer including a single- or multi-layer of a composite material of Sn, solder, Pd, Au or Ag (with a thickness of 10 nm to 10 μm). Alternatively, a conductive paste including metal particles of Ag, or the like, can be used.

Furthermore, a ball electrode or bump electrode of solder such as Au, or the like, can be used.

The lid 5 is made of glass or metal, in which the center portion of the surface facing to the base 2 is bored to form a concave portion for housing the crystal resonator 6.

The concave portion of the lid 5 has a depth of, for example, about 0.05 to 1.5 mm, and can be formed by etching, sandblasting, hot pressing, laser, or the like.

The opening of the lid 5 is bonded to the base 2 by anodic bonding or bond. The top surface of the base 2 and the concave portion of the lid 5 form the cavity 9 for housing the crystal resonator 6.

In addition to anodic bonding, the bonding of the base 2 and the lid 5 can be performed by direct bonding, metal bonding, low melting point glass, brazing, welding, or high melting point solder.

The cavity 9 is sealed to be isolated from the outside air by the lid 5 and the base 2. For example, the cavity 9 is hermetically sealed to be kept in a vacuum state or sealed with a predetermined gas.

Thus, the cavity 9 is hermetically sealed, so it is very important for the stress buffer layer 3 to prevent the base 2 from being damaged in order to increase the reliability of the electronic component 1*a*.

In the electronic component 1*a*, the cavity 9 is formed by providing the concave portion on the lid 5. However, the cavity 9 may also be formed by providing a concave portion on the base 2 and bonding the lid 5 having a flat plate shape to the base 2. Or, the cavity 9 may also be formed by providing concave portions on both the lid 5 and the base 2.

In this embodiment, the lid 5 is disposed on one surface (the top surface) of the base member (the base 2) and works as a lid for forming a cavity (the cavity 9) isolated from the outside air by the lid 5 and the one surface. An electronic device (the crystal resonator 6) is disposed in this cavity (the cavity 6).

Also, a window (not shown) can be provided to perform trimming, bonding, and gettering on the crystal resonator 6 using laser from the outside on the side of the bottom surface of the electronic component 1*a* without forming a portion of the external electrodes 4, 8 and stress buffer layer 3.

Gettering is a technique, used in vacuum-sealing, to apply laser light to and heat an Al pattern, or the like, disposed in a space to cause the reaction of Al and ambient air (oxygen) to consume the air, thereby increasing the vacuum level in the space.

Thus, also in the electronic component 1*a*, the transparency of glass advantageously allows the crystal resonator 6 to be irradiated with laser light from the outside of the package and trimmed so as to oscillate at a desired frequency.

The electronic component 1*a*, configured as described above, is mounted on the surface of the printed circuit board by fixing the bottom surface of the external electrodes 4, 8 to the printed circuit board using soldering, Au bump, or conductive adhesive.

For example, the electronic component 1*a* is used as an oscillating device in an electronic apparatus such as personal computer, watch, and game machine.

With the electronic component 1*a* mounted in this way, when the printed circuit board is deformed, the stress buffer layer 3 bends to absorb stress, thereby reducing the stress on the base 2 to decrease the risk of damaging the base 2.

Thus, the electronic component 1*a* provides effects as follows:

(1) The stress buffer layer 3 is less elastic than metal and glass and can reduce stress on the base 2. This can effectively reduce the risk of damaging the base 2, even if the base 2 is made of glass.

(2) Reducing the stress eliminates the need for reinforcing the glass of the base 2, thereby avoiding adverse effects, such as warping, accompanied with glass reinforcement treatment.

(3) The external electrodes 4, 8, having good solder wettability formed on the stress buffer layer 3, allow the electronic component 1*a* to be surface-mounted easily and reliably.

Second Embodiment

Figure 2:
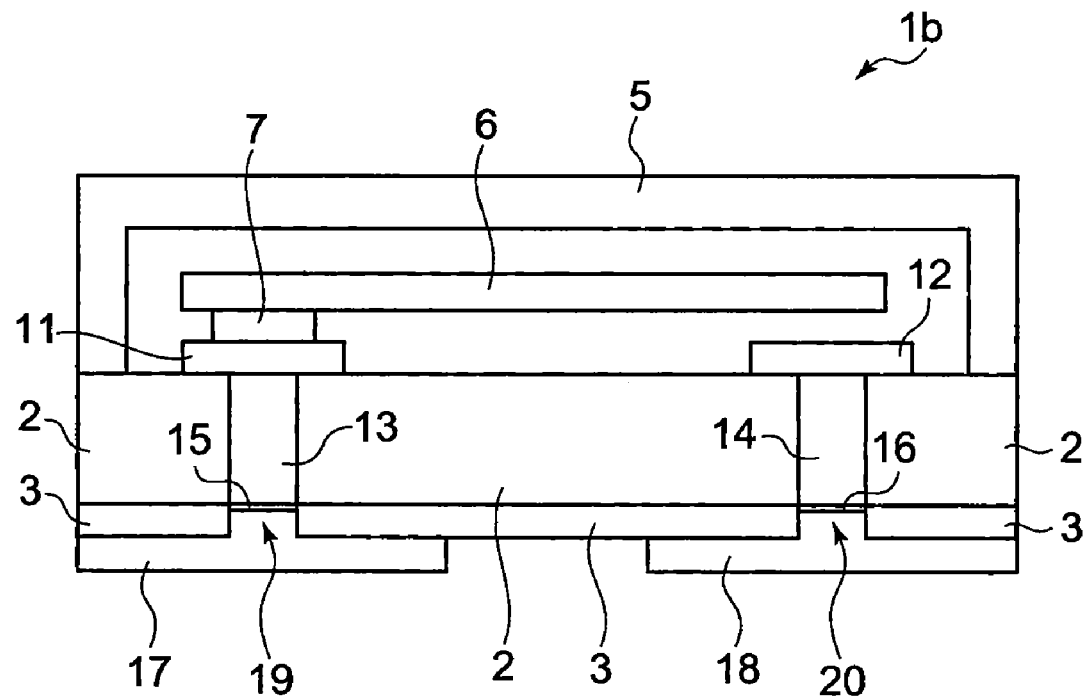
FIG. 2 is a diagram showing the cross-section of an electronic component in accordance with a second embodiment.
Figure 3A:
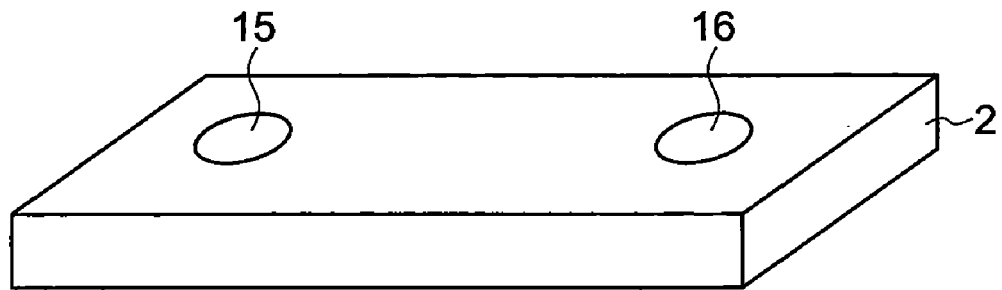
FIGS. 3A-3D are diagrams showing a manufacturing method of the electronic component in accordance with the second embodiment.
Figure 3B:
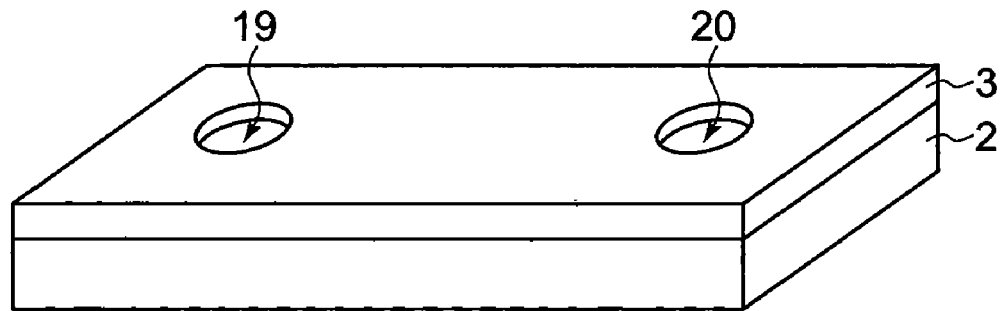
Figure 3C:
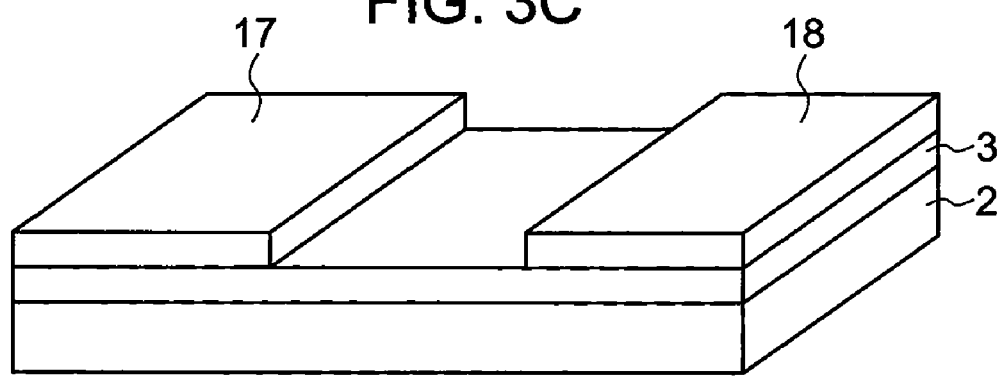
Figure 3D:
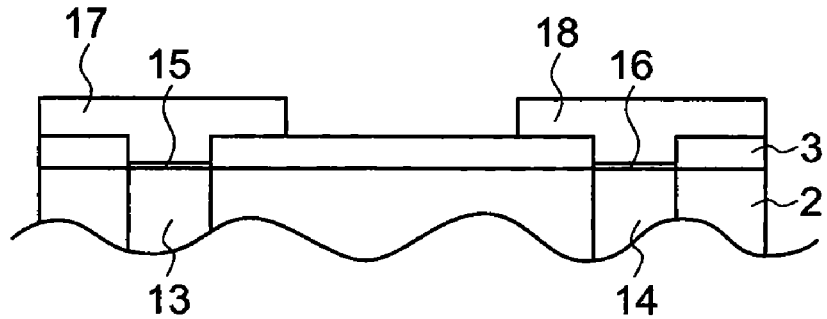

FIG. 2 is a cross-sectional view of an electronic component 1*b* in accordance with a second embodiment.

In FIG. 2, components like those in the electronic component 1*a* are denoted by like numerals, and the description is simplified or omitted.

In the electronic component 1*b*, two through-holes are formed in a base 2, within which through-electrodes 13, 14 are formed, respectively.

For example, the through-electrodes 13, 14 are formed by heat-treating and curing conductive paste such as glass silver paste, or made of metal bar, metal plating, or the like. The edge surfaces of the through-electrodes 13, 14 on the top surface side of the base 2 are connected to internal wirings 11, 12 disposed on two electrodes of a crystal resonator 6, respectively.

On the edge surfaces of the through-electrodes 13, 14 on the bottom surface side, conductive connecting layers 15, 16 are provided to enhance adhesion between external electrodes 17, 18 and the through-electrodes 13, 14, respectively. The connecting layers 15, 16 are formed by, for example, sputtering, vapor deposition, plating, conductive paste, or the like.

A stress buffer layer 3 is formed of insulating resin, and the like, over the whole bottom surface of the base 2, as in the electronic component 1*a*. Openings 19, 20 including through-holes passing through the stress buffer layer 3 are formed aligned with the through-electrodes 13, 14, respectively. Thus, the stress buffer layer 3 is formed over the whole bottom surface of the base 2, except the openings 19, 20.

In addition, on the bottom surface of the stress buffer layer 3, the external electrodes 17, 18 are formed at the locations on which the openings 19, 20 are formed, respectively.

The external electrodes 17, 18 are formed of metal film, made in a way similar to that of the external electrodes of the electronic component 1*a*, extending to the inside of the openings 19, 20 and connected to the through-electrodes 13, 14 via the connecting layers 15, 16, respectively.

The external electrode 17 is extended around the opening 19. The extended portion of the external electrode 17 is formed on the bottom surface of the stress buffer layer 3. Accordingly, the stress buffer layer 3 can effectively absorb the displacement of the external electrode 17.

Similarly, the external electrode 18 is extended around the opening 20, and the stress buffer layer 3 can absorb the displacement of the external electrode 18.

In FIG. 2, the external electrodes 17, 18 are formed to extend to both of the edges of the stress buffer layer 3. However, the external electrodes 17, 18 may be formed so as not to reach the edges of the stress buffer layer 3. This can ensure that the stress buffer layer 3 exists around the external electrodes 17, 18 in which stress tends to concentrate after soldering is performed.

Thus, in the electronic component 1*b*, an electric signal from the crystal resonator 6 travels through the internal wirings 11, 12, the through-electrodes 13, 14, and the external electrodes 17, 18 filled in the openings 19, 20, and the like, to the bottom surface of the stress buffer layer 3.

Then, with the electronic component 1*b* mounted on the printed circuit board, when the printed circuit board is deformed, the stress buffer layer 3 bends to absorb stress, thereby reducing the stress on the base 2 to effectively decrease the risk of damaging the base 2.

As described above, in the electronic component 1*b*, a stress buffer member (the stress buffer layer 3) is made of an insulating material, and external electrodes (the external electrodes 17, 18) are in continuity with the electrodes of an electronic device (the crystal resonator 6) via through-holes (the opening 19, 20) formed in the stress buffer member.

Then, the electronic component 1*b* includes conductive members (the through-electrodes 13, 14) passing through a base member (the base 2) and providing the continuity between the electrodes of the electronic device (the crystal resonator 6) and the external electrodes (the external electrodes 17, 18).

FIG. 3 shows the steps of forming the stress buffer layer 3 and the external electrodes 17, 18 of the electronic component 1*b*.

FIG. 3(*a*) shows the base 2 viewed from the bottom surface side.

First, the through-electrodes 13, 14 (not shown) are formed in the through-holes of the base 2. Then, on the edge surfaces of the through-electrodes 13, 14 on the bottom surface side, the connecting layers 15, 16 are formed by sputtering, vapor deposition, plating, conductive paste or the like.

When good adhesion can be achieved between the external electrodes 17, 18 and the through-electrodes 13, 14 without forming the connecting layers 15, 16 (for example, when the through-electrodes 13, 14 are made of metal bars), forming the connecting layers 15, 16 is not indispensable.

Electrodes exposed on the bottom surface of the base 2, including the connecting layers 15, 16, form glass surface electrodes.

Next, as shown in FIG. 3(*b*), the stress buffer layer 3 is formed over the whole bottom surface of the base 2, and the openings 19, 20 are formed (stress buffer member forming step). The stress buffer layer 3 is formed by, for example, spin coating, spray coating, printing, or the like.

The openings 19, 20 are formed, for example, by printing using a mask corresponding with the openings 19, 20, or by spin coating and spray coating light-sensitive resin and using photolithography (through-hole forming step).

Then, as shown in FIG. 3(*c*), the external electrodes 17, 18 are disposed by forming the external electrodes 17, 18 over the openings 19, 20 (external electrode disposing step).

The external electrodes 17, 18 can be formed by sputtering, vapor deposition, plating, conductive paste, or the like.

Through the above-described steps, as shown in FIG. 3(*d*), the external electrodes 17, 18 are disposed on the base 2 with the stress buffer layer 3 therebetween.

Third Embodiment

Figure 4:
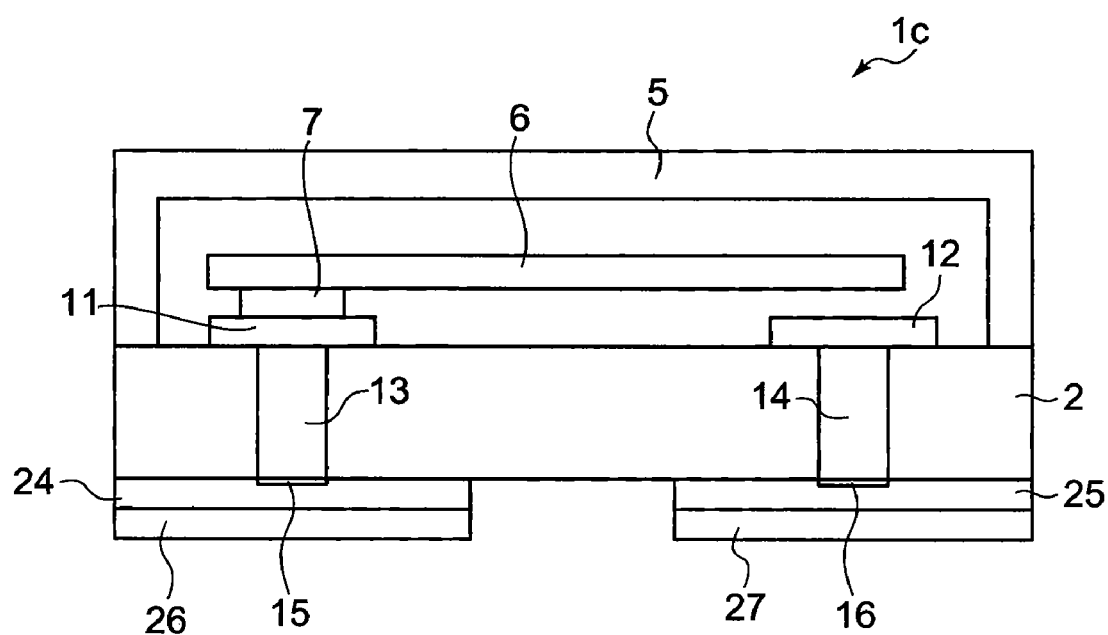
FIG. 4 is a diagram showing the cross-section of an electronic component in accordance with a third embodiment.
Figure 5A:
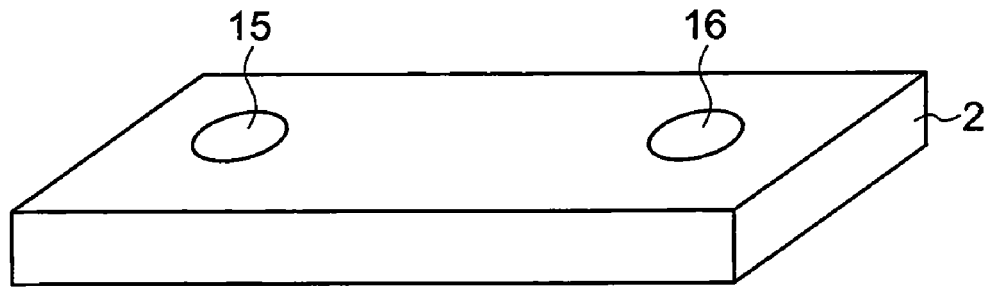
FIGS. 5A-5D are diagrams showing a manufacturing method of the electronic component in accordance with the third embodiment.
Figure 5B:
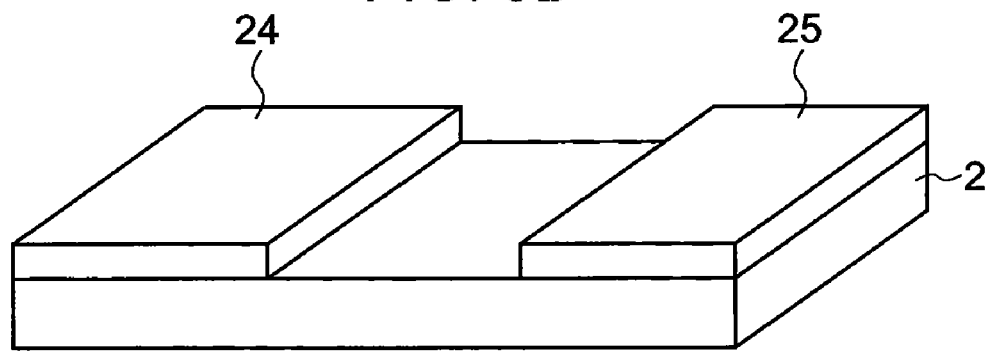
Figure 5C:
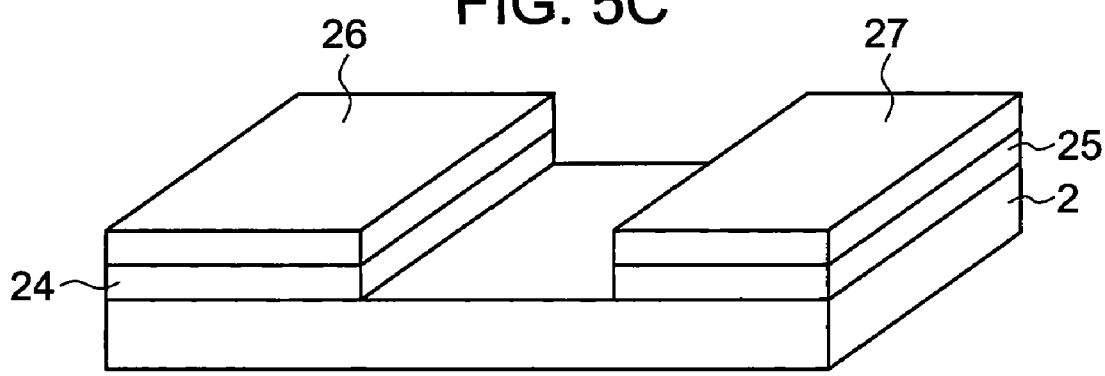
Figure 5D:
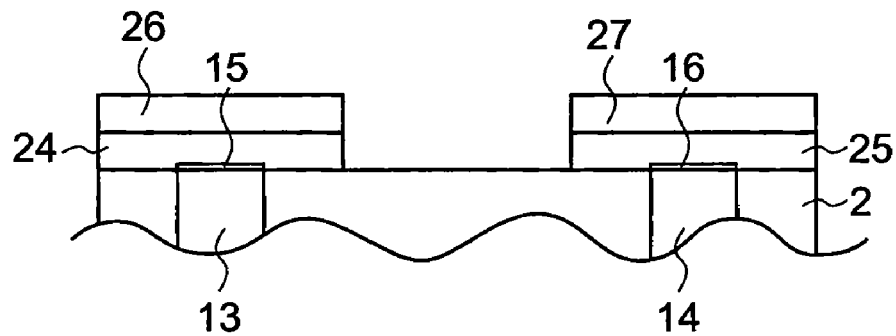

FIG. 4 is a cross-sectional view of an electronic component 1*c* in accordance with a third embodiment.

In FIG. 4, components like those in the electronic component 1*b* are denoted by like numerals, and the description is simplified or omitted.

In the electronic component 1*c*, stress buffer layers 24, 25 that are conductive are formed at the locations of through-electrodes 13, 14 on the bottom surface of a base 2. The stress buffer layers 24, 25 are electrically connected to the through-electrodes 13, 14 via connecting layers 15, 16, respectively.

As for the material of the stress buffer layer 24, 25, for example, the resin used for the stress buffer layer 3 of the electronic component 1*a* mixed with a conductive filler can be used, the conductive filler being the mixture of one or more types of single metals or alloys of Ag, Au, Cu, Ni, Sn, or the like.

On the bottom surfaces of the stress buffer layers 24, 25, external electrodes 26, 27 are formed, respectively. The external electrodes 26, 27 are made in a way similar to that of the external electrodes 17, 18 of the electronic component 1*b*.

Thus, in the electronic component 1*c*, the stress buffer layers are made of a conductive material, so the stress buffer layers are separately formed for each electrode to prevent the short circuit between the electrodes.

The external electrodes 26, 27 are in continuity with a crystal resonator 6 via the stress buffer layers 24, 25 and the through-electrodes 13, 14, respectively.

In this way, in the electronic component 1*c*, the stress buffer layers can double as external electrode supporting means and continuity means by being made of a conductive material such as a conductive resin.

In the electronic component 1*b*, the external electrodes 17, 18 pass through the openings 19, 20 to connect to the through-electrodes 13, 14. In the electronic component 1*c*, the external electrodes 26, 27 connect to the through-electrodes 13, 14 through the stress buffer layers 24, 25, so stress on the base 2 due to the bending of the printed circuit board, or the like, can be more effectively reduced.

As described above, in the electronic component 1*c*, stress buffer members (the stress buffer layers 24, 25) are made of a conductive material, and external electrodes (the external electrodes 26, 27) are in continuity with the electrodes of an electronic device (the crystal resonator 6) via the stress buffer members.

Then, the electronic component 1*c* includes conductive members (the through-electrodes 13, 14) passing through a base member (the base 2) and providing the continuity between the electrodes of the electronic device (the crystal resonator 6) and the external electrodes (the external electrodes 26, 27).

FIG. 5 shows the steps of forming the stress buffer layers 24, 25 and the external electrodes 26, 27 of the electronic component 1*c*.

FIG. 5(*a*) shows the base 2 viewed from the bottom surface side.

First, the through-electrodes 13, 14 (not shown) are formed in the through-holes of the base 2. Then, on the edge surfaces of the through-electrodes 13, 14 on the bottom surface side, the connecting layers 15, 16 are formed. This is the same as in the electronic component 1*b*.

Next, as shown in FIG. 5(*b*), the individual stress buffer layer 24, 25 are formed at the locations of the connecting layers 15, 16 of the base 2 (at the locations of the through-electrodes 13, 14 not shown), respectively.

They can be formed by, for example, printing a conductive resin using a mask.

Then, as shown in FIG. 5(*c*), the external electrodes 26, 27 are formed on the surfaces of the stress buffer layers 24, 25.

Like the external electrodes 17, 18, the external electrodes 26, 27 can be formed by sputtering, vapor deposition, plating, conductive paste, or the like.

Through the above-described steps, as shown in FIG. 5(*d*), the external electrodes 26, 27 in continuity with the through-electrodes 13, 14 are disposed on the base 2 with the stress buffer layer 3 therebetween.

Fourth Embodiment

Figure 6:
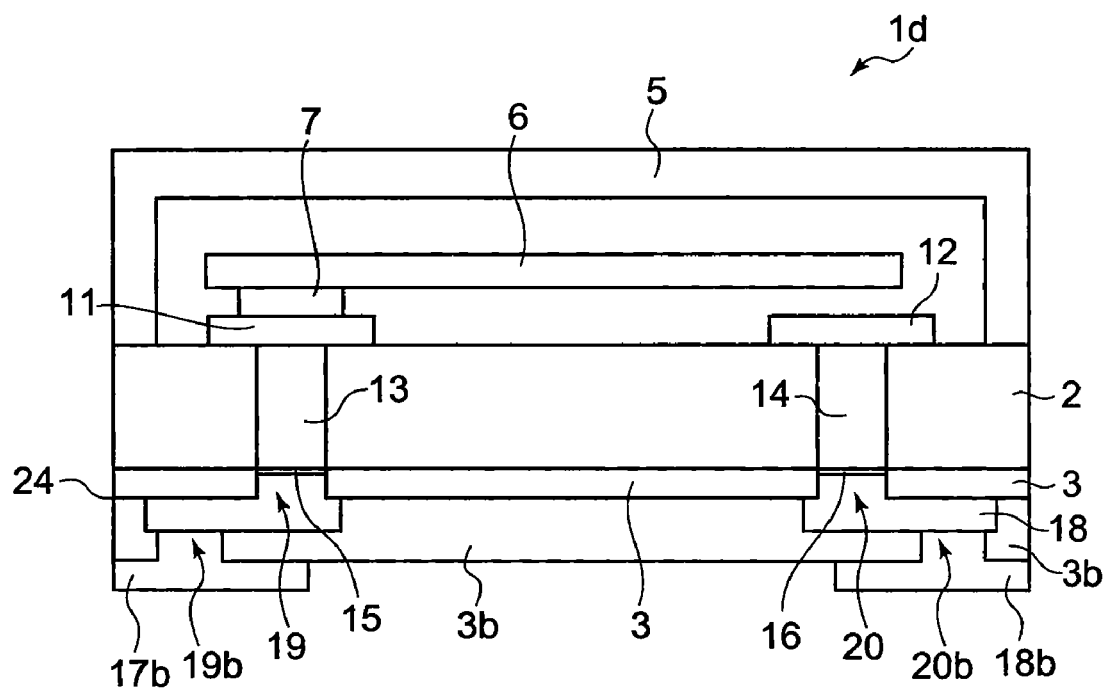
FIG. 6 is a diagram showing the cross-section of an electronic component in accordance with a fourth embodiment.

FIG. 6 is a cross-sectional view of an electronic component 1d in accordance with a fourth embodiment.

In FIG. 6, components like those in the electronic component 1b are denoted by like numerals, and the description is simplified or omitted.

The electronic component 1d is formed by adding a stress buffer layer 3b and external electrodes 17b, 18b.

More specifically, external electrodes 17, 18 are formed as rewiring layers from the openings 19, 20 on the stress buffer layer 3, and second openings (openings 19b, 20b) are formed in areas that do not overlap with first openings (the openings 19, 20).

Note that the external electrodes 17, 18 work as wirings formed between the stress buffer layer 3 (the first stress buffer layer) and the stress buffer layer 3b (the second stress buffer layer).

Like the stress buffer layer 3, the stress buffer layer 3b is made of an insulating material.

The stress buffer layer 3b is formed in a laminar shape on the bottom surface of the stress buffer layer 3, covering the whole of the external electrodes 17, 18.

The material of the stress buffer layer 3b may or may not be the same as that of the stress buffer layer 3.

On the bottom surface of the stress buffer layer 3, the external electrode 17 extends from the location of the through-electrode 13 toward one edge of the base 2.

In the stress buffer layer 3b, the opening 19b is formed on the extended portion of the external electrode 17. Thus, the opening 19 and the opening 19b are formed at different locations.

Like the external electrode 17, the external electrode 18 also extends toward another edge of the base 2, and the opening 20b is formed on the extended portion of the external electrode 18.

Note that, in this embodiment, the external electrodes 17, 18 extend toward the edges of the base 2. However, they may extend in other directions such as toward the center of the base 2, or in a direction perpendicular to the direction toward the edges.

On the bottom surface of the stress buffer layer 3b, the external electrodes 17b, 18b are formed.

The external electrodes 17b connects to the extended portion of the external electrodes 17 through the opening 19b.

Thus, the external electrode 17 connects to the through-electrode 13 and the external electrode 17b at different locations in a plane parallel to the stress buffer layer 3.

Thus, the external electrode 17b does not connect directly to the through-electrode 13, so even if the external electrode 17b is displaced due to the bending of the printed circuit board, or the like, the stress is reduced by the stress buffer layer 3b and the stress buffer layer 3, further reducing the stress on the through-electrode 13.

Similarly, the external electrode 18b connects to the extended portion of the external electrode 18b through the opening 20b, so even if the external electrode 18b is displaced due to the bending of the printed circuit board, or the like, the stress on the through-electrode 14 is further reduced than the case with only one stress buffer layer.

As described above, the electronic component 1d includes: a second buffer member (the stress buffer layer 3b) formed on the surface (the bottom surface, in this embodiment) of the stress buffer member (the stress buffer layer 3), with second through-holes (the openings 19b, 20b) formed at locations different from those of the through-holes (the openings 19, 20) of the stress buffer member (the stress buffer layer 3); and second external electrodes (the external electrodes 17b, 18b) in continuity with external electrodes (the external electrodes 17, 18) through the second through-holes (the openings 19b, 20b) and disposed on the surface (the bottom surface, in this embodiment) of the second buffer member (the stress buffer layer 3b).

FIG. 7 shows the steps of forming the stress buffer layers 3, 3b and the external electrodes 17, 18, 17b, 18b of the electronic component 1d.

Figure 7A:
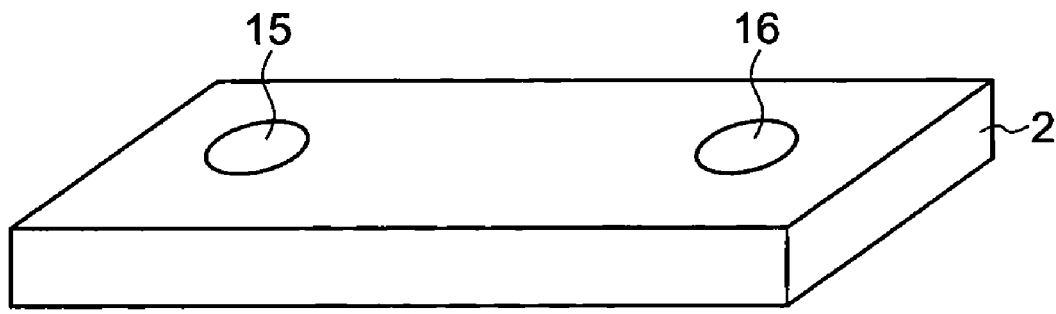
FIGS. 7A-7C are diagrams showing a manufacturing method of the electronic component in accordance with the fourth embodiment.

FIG. 7(a) shows the base 2 viewed from the bottom surface side.

First, the through-electrodes 13, 14 (not shown) are formed in the through-holes of the base 2. Then, on the edge surfaces of the through-electrodes 13, 14 on the bottom surface side, the connecting layers 15, 16 are formed.

Figure 7B:
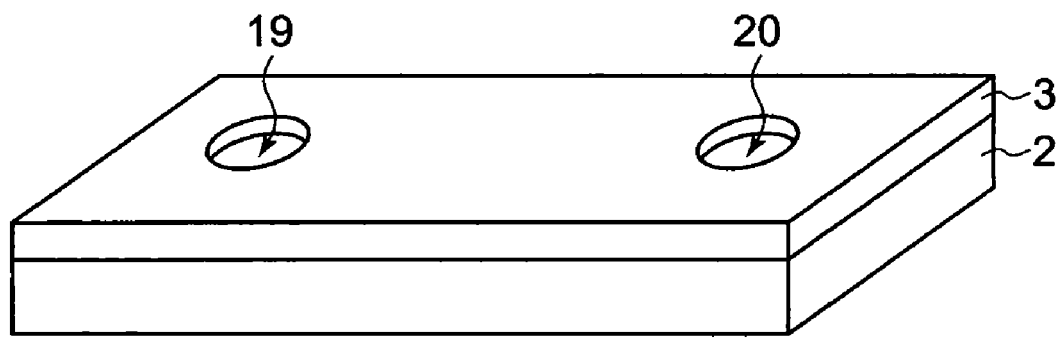

Next, as shown in FIG. 7(b), the stress buffer layer 3 is formed over the whole bottom surface of the base 2, and the openings 19, 20 are formed.

These steps of the manufacturing method are similar to those for the electronic component 1b.

Figure 7C:
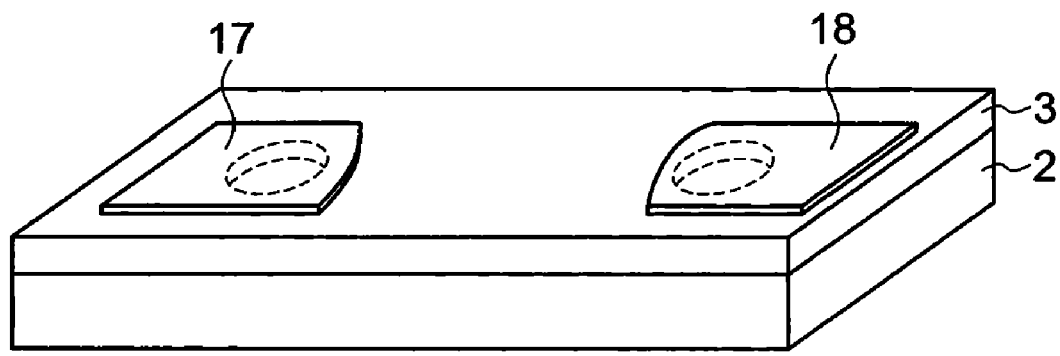

Then, as shown in FIG. 7(c), external electrodes 17, 18 are formed as rewiring layers over the openings 19, 20, respectively, by pattern wiring, or the like.

The external electrodes 17, 18 can be formed by sputtering, vapor deposition, plating, conductive paste, or the like.

The external electrode 17 extends from the location of the opening 19 toward one edge of the base 2. Around the external electrode 17, a space for forming the stress buffer layer 3b is reserved so that the stress buffer layer 3b can cover the whole of the external electrode 17. This similarly applies to the external electrode 18.

FIG. 8 shows the steps continued from the step shown in FIG. 7(c).

Figure 8A:
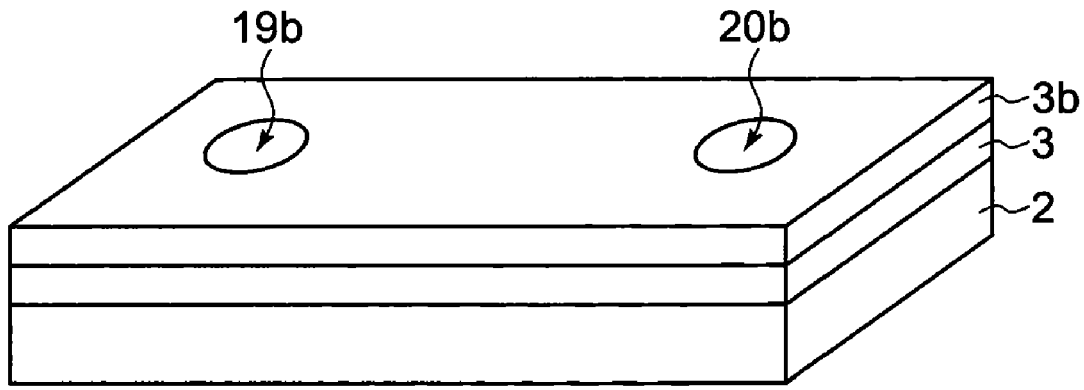
FIGS. 8A-8C are diagrams showing a manufacturing method of the electronic component in accordance with the fourth embodiment.

As shown in FIG. 8(a), the stress buffer layer 3b is formed over the whole surface of the stress buffer layer 3, and the openings 19b, 20b are formed on the extended portions of the external electrodes 17, 18, respectively.

Forming the stress buffer layer 3b and forming the openings 19b, 20b are performed in a way similar to forming the openings 19, 20 on the stress buffer layer 3.

In this way, the resin of the second layer is formed such that the portion of the rewiring layers to be the external electrodes are exposed through the openings 19b, 20b.

Figure 8B:
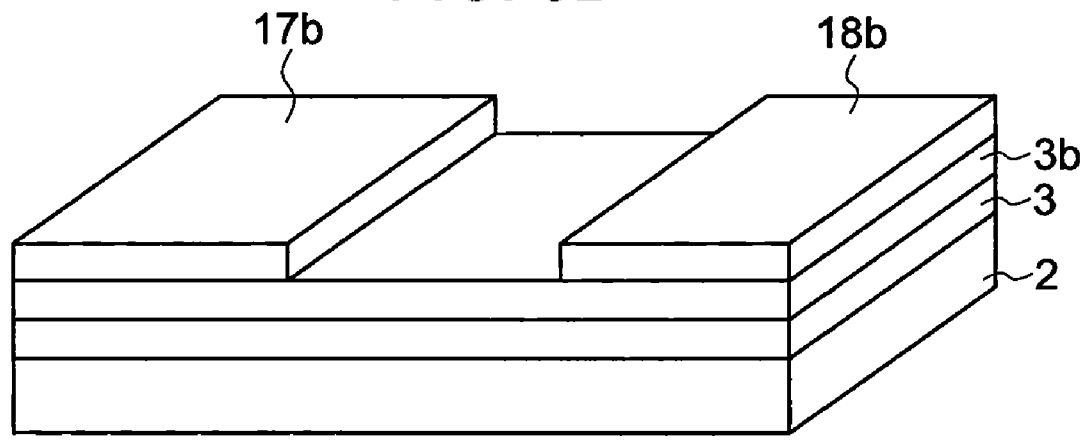

Then, as shown in FIG. 8(b), the external electrodes 17b, 18b are formed over the openings 19b, 20b.

The external electrodes 17b, 18b can be formed by sputtering, vapor deposition, plating, conductive paste, or the like.

Figure 8C:
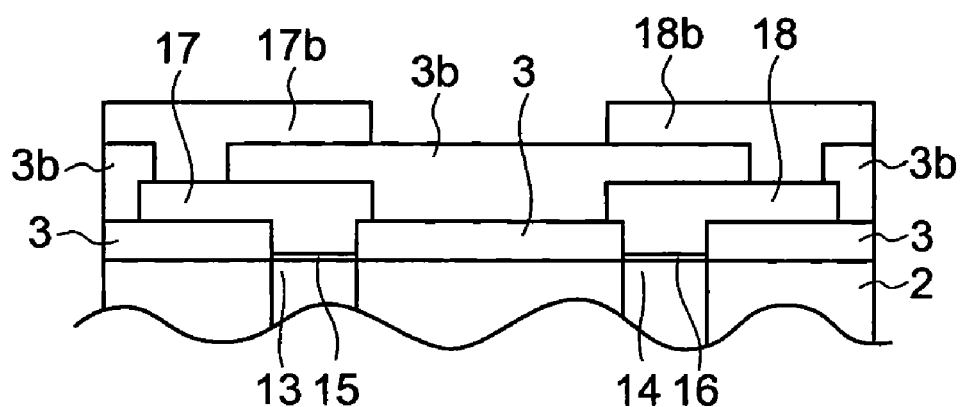

Through the above-described steps, as shown in FIG. 8(c), the external electrodes 17, 18 are disposed on the base 2 with the stress buffer layer 3 therebetween, and the external electrodes 17b, 18b are disposed with the stress buffer layer 3b therebetween.

The external electrode 17 connects to the through-electrode 13 and the external electrode 17b at different locations, and the external electrode 18 connects to the through-electrode 14 and the external electrode 18b at different locations.

Fifth Embodiment

Figure 9A:
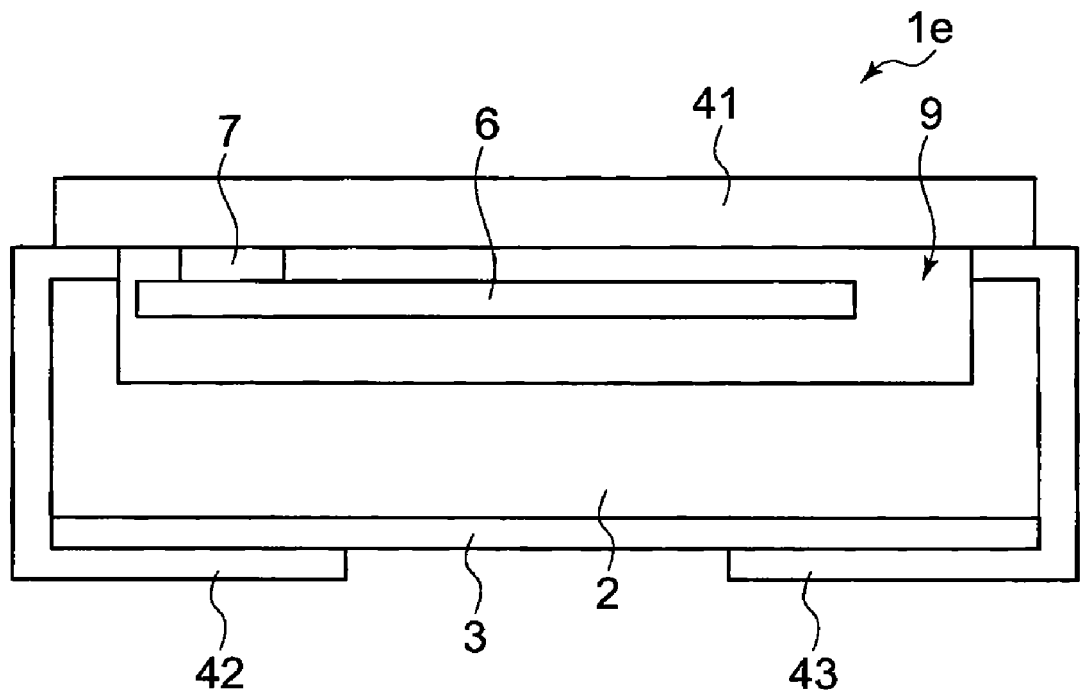
FIGS. 9A-9B are diagrams showing the cross-section of electronic components in accordance with fifth and sixth embodiments.

FIG. 9(a) is a cross-sectional view of an electronic component 1e in accordance with a fifth embodiment.

In FIG. 9(a), components like those in the electronic component 1a are denoted by like numerals, and the description is simplified or omitted.

In the electronic component 1e, a concave portion is formed at the center of a base 2, and a lid 41 is bonded to the top edge surface of the concave portion forming a cavity 9.

In the cavity 9, a crystal resonator 6 is disposed on the bottom surface of the lid 41 supported by a supporting member 7.

A stress buffer layer 3 made of an insulating material is formed over the whole bottom surface of the base 2. The electrodes of the crystal resonator 6 are formed to extend to the bottom surface of the stress buffer layer 3 through external electrodes 42, 43 provided on the side surfaces of the base 2, respectively.

Thus, the crystal resonator 6 can be disposed on the base 2 by disposing the crystal resonator 6 on the bottom surface of the lid 41, rather than the top surface of the base 2.

Also in this embodiment, an electronic device (the crystal resonator 6) is disposed on one surface (the top surface) side of a base member (the base 2), and a stress buffer member (the stress buffer layer 3) is formed on the other surface (the bottom surface) of the base member (the base 2).

Sixth Embodiment

Figure 9B:
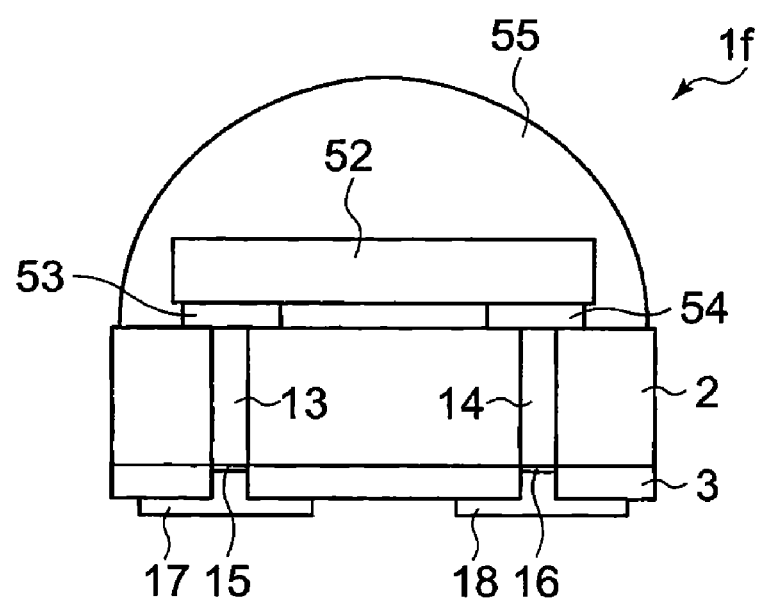

FIG. 9(b) is a cross-sectional view of an electronic component 1f in accordance with a sixth embodiment.

In FIG. 9, components like those in the electronic component 1a are denoted by like numerals, and the description is simplified or omitted.

In the electronic component 1f, an electronic device 52 is disposed on a base 2, or the like, similar to that of the electronic component 1b.

The electronic device 52 is an electronic device for generating an electric signal such as an integrated circuit (IC), a semiconductor, a sensor, a piezoelectric device or other electronic device chips. On its electrodes 53, 54 on the bottom surface, the electronic device 52 is disposed over the top surface of the base 2.

A lid 55 is formed over the top surface of the base 2, and the electronic device 52 is hermetically sealed.

A stress buffer layer 3 made of an insulating material is formed over the whole bottom surface of the base 2, and external electrodes 17, 18 are formed on the bottom surface of the stress buffer layer 3.

The external electrode 17 connects to the electrode 53 through a through-electrode 13, and the external electrode 18 connects to the electrode 54 through a through-electrode 14.

Thus, over the top surface side of the base 2, various electronic devices can be disposed in addition to a crystal resonator 6.

While various embodiments have been described above, the base 2 can also be made of ceramic, for example.

Packages made of a conventional ceramic have very high strength, so a stress buffer layer as used in the above-described embodiments does not need to be provided. However, as the ceramic becomes thinner, cracking due to displacement may occur as with glass.

In such a case, providing a stress buffer layer on the bottom surface of a base made of ceramic and disposing external electrodes on the stress buffer layer can effectively reduce the risk of damaging the base.

In the embodiments described above and variations thereof, the crystal resonator 6 is used as an example of an electronic device, but a semiconductor such as light receiving and emitting device may also be used.

In using the light receiving and emitting device, the transparency of the glass is an advantage. However, if the optical characteristics such as spectral sensitivity, transmittance and secular change in color need to be considered, a filter is desirably formed on the glass, for example.

Also, the embodiments and variations thereof may similarly be applied to a surface mounted package sealing an electronic device including chips such as ICs and a plurality of chips and elements such as a MEMS (micro electro mechanical systems) sensor, an optical component, a high-frequency device, and a multichip module.

Also, when applied to a semiconductor product, the embodiments and variations thereof are more advantageous in moisture resistance, or the like, than packages using resin because glass is impervious to water.

Note that, any residual ion (acid ion or alkali ion) may cause corrosion of circuit, or the like, so the concentrations of ions and impurities in the glass need to be cared, for example, by using non-alkali glass.

Also, the embodiments and variations thereof may be applied to a package such as a battery and capacitor, sealing an electrolyte therein.

Glass has the advantage of high corrosion resistance to an electrolyte, but the electrolyte reacts or vaporizes at a high temperature. This problem may be addressed by performing the production process at a lower temperature or providing a structure withstanding high internal pressure, for example, by bonding a lid member to a base member using a construction method of performing strong bonding even if a little liquid exists in the area to be bonded, such as resistance seam bonding, electron beam welding or laser welding.

What is claimed is:

1. An electronic package containing an electronic component, comprising:
    a base member forming at least a part of the electronic package and having a lower surface, wherein the base member is formed with a pair of through-holes;
    external electrodes electrically connected to the electronic component in the electronic package, wherein the external electrodes are arranged connectable to a circuit board for electrical connection; and
    a stress buffer layer applied over at least a part of the lower surface of the base member between the electrodes and the base member, the stress buffer layer comprising a pair of layer members made of a conductive material and applied respectively over the through-holes of the base member, such that the external electrodes are electrically connected to the electronic component via the pair of layer member and the through-holes.

2. The electronic package according to claim 1, further comprising a lid member to hermetically close the electronic package with the base member, wherein a cavity is formed inside the package for housing the electronic component.

3. The electronic package according to claim 1, wherein the external electrodes are extensive over the stress buffer layer from a periphery of the base member.

4. The electronic package according to claim 1, wherein the electronic component is a piezoelectric vibrating strip.

5. A method of producing an electronic package containing an electronic component, comprising:
    preparing a base member forming at least a part of the electronic package and having a lower surface;
    forming a pair of through-holes through the base member;
    applying a stress buffer layer over at least a part of the lower surface of the base member, wherein the stress buffer layer comprises a pair of layer members made of a conductive material and formed respectively over the through-holes of the base member; and
    forming external electrodes on the stress buffer layer opposite to the base member such that the electrodes are electrically connected via the pair of layer members and the through-holes to the electronic component in the electronic package, wherein the external electrodes are arranged connectable to a circuit board for electrical connection.

6. The method according to claim 5, further comprising preparing a lid member and hermetically closing the electronic package with the base member, wherein a cavity is formed inside the package for housing the electronic component.

7. The method according to claim 5, wherein forming the external electrodes comprises extending the electrodes over the stress buffer layer from a periphery of the base member.

8. An electronic package containing an electronic component, comprising:
   a base member forming at least a part of the electronic package and having a lower surface, wherein the base member is formed with a pair of through-holes;
   external electrodes electrically connected to the electronic component in the electronic package, wherein the external electrodes are arranged connectable to a circuit board for electrical connection; and
   a stress buffer layer applied over at least a part of the lower surface of the base member between the electrodes and the base member, wherein the stress buffer layer comprises first and second sub-layers each formed with a pair of through-holes, and the external electrodes are electrically connected to the electronic component through the through-holes of the first and second sub-layers, and wherein the through-holes formed in the first sub-layer and the through-holes formed in the second sub-layer are unaligned, and the external electrodes each have a bridge located between the first and second sub-layer for electrically connecting the through-holes of the first and second sub-layers.

9. A method of producing an electronic package containing an electronic component, comprising:
   preparing a base member forming at least a part of the electronic package and having a lower surface;
   forming a pair of through-holes through the base member;
   applying a stress buffer layer over at least a part of the lower surface of the base member, wherein the stress buffer layer comprises first and second sub-layers each formed with a pair of through-holes, and the through-holes formed in the first sub-layer and the through-holes formed in the second sub-layer are unaligned; and
   forming external electrodes on the stress buffer layer opposite to the base member, wherein each of the electrodes comprises a bridge between the first and second sub-layers for electrically connecting the through-holes of the first and second sub-layers to thereby connect the external electrode to the electronic component in the electronic package via the through-holes of the first and second sub-layers and the through-holes of the base member, and wherein the external electrodes are arranged connectable to a circuit board for electrical connection.

\* \* \* \* \*